(12) United States Patent
Seol et al.

(10) Patent No.: US 9,813,099 B2
(45) Date of Patent: Nov. 7, 2017

(54) ELECTRONIC DEVICE WITH ANTENNA DEVICE

(71) Applicant: Samsung Electronics Co., Ltd., Gyeonggi-do (KR)

(72) Inventors: Kyung-Moon Seol, Seoul (KR); Ji-Ho Kim, Gyeonggi-do (KR); Jae-Won Choe, Gyeonggi-do (KR); Gyu-Bok Park, Gyeonggi-do (KR); Jae-Moon Lee, Seoul (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/148,385

(22) Filed: May 6, 2016

(65) Prior Publication Data

US 2016/0344439 A1 Nov. 24, 2016

(30) Foreign Application Priority Data

May 19, 2015 (KR) ........................ 10-2015-0069476

(51) Int. Cl.
*H04M 1/00* (2006.01)
*H04B 1/3888* (2015.01)
(Continued)

(52) U.S. Cl.
CPC ......... *H04B 1/3888* (2013.01); *G06F 1/1656* (2013.01); *H01Q 1/243* (2013.01);
(Continued)

(58) Field of Classification Search
None
See application file for complete search history.

(56) References Cited

U.S. PATENT DOCUMENTS

2013/0234910 A1* 9/2013 Oh ........................ H01Q 1/243
343/872
2014/0078008 A1 3/2014 Kang et al.
(Continued)

FOREIGN PATENT DOCUMENTS

EP 2 493 009 8/2012
KR 1020080095597 10/2008
(Continued)

OTHER PUBLICATIONS

European Search Report dated Oct. 26, 2016 issued in counterpart application No. 16170387.1-1811, 6 pages.

*Primary Examiner* — Idowu O Osifade
(74) *Attorney, Agent, or Firm* — The Farrell Law Firm, P.C.

(57) ABSTRACT

An electronic device with an antenna device is provided. The electronic device includes a case member that includes a first face, a second face disposed opposite to the first face, and side walls that enclose a space between the first face and the second face, a first metallic member that forms at least a portion of the side walls of the case member or is formed adjacent to the side walls, a metal pattern disposed within the case member and extends from a portion of the first metallic member to another portion of the first metallic member, the first metallic member and the metal pattern electrically forming at least a portion of a closed loop, a wireless communication circuit electrically connected to a portion of the metal pattern, a ground member positioned within the case member, and a portion of the metal pattern disposed adjacent to the ground member.

15 Claims, 12 Drawing Sheets

(51) Int. Cl.
*H01Q 1/24* (2006.01)
*H01Q 1/44* (2006.01)
*H01Q 1/48* (2006.01)
*H01Q 7/00* (2006.01)
*H01Q 9/42* (2006.01)
*H01Q 21/28* (2006.01)
*G06F 1/16* (2006.01)
*H01Q 9/04* (2006.01)
*H05K 5/02* (2006.01)

(52) U.S. Cl.
CPC ................. *H01Q 1/44* (2013.01); *H01Q 1/48* (2013.01); *H01Q 7/00* (2013.01); *H01Q 9/0407* (2013.01); *H01Q 9/0421* (2013.01); *H01Q 9/42* (2013.01); *H01Q 21/28* (2013.01); *H05K 5/0247* (2013.01)

(56) References Cited

U.S. PATENT DOCUMENTS

2014/0087674 A1  3/2014  Teng et al.
2014/0168015 A1  6/2014  Kim

FOREIGN PATENT DOCUMENTS

KR   1020100114362   10/2010
KR   1020110044576   4/2011

* cited by examiner

ELECTRONIC DEVICE WITH ANTENNA DEVICE

PRIORITY

This application claims priority under 35 U.S.C. §119(a) to Korean Patent Application Serial No. 10-2015-0069476, which was filed in the Korean Intellectual Property Office on May 19, 2015, the entire content of which is incorporated herein by reference.

BACKGROUND

1. Field of the Disclosure

The present disclosure generally relates to an electronic device and more particularly to an electronic device that is capable of transmitting/receiving a radio frequency (RF) signal.

2. Description of the Related Art

Typically, an electronic device refers to a device that performs a specific function according to a stored program (e.g., an electronic scheduler, a portable multimedia reproducer, a mobile communication terminal, a tablet PC, an image/sound device, a desktop/laptop PC, a vehicular navigation system, or a home appliance). For example, such an electronic device may output information stored therein as sound or an image. As the degree of integration of such an electronic device has increased, and high speed and large capacity wireless communication has become popular, various functions have recently been equipped in a single electronic device, such as a mobile communication terminal. For example, functions, such as an entertainment function (e.g., a game function), a multimedia function (e.g., a music/video reproducing function), a communication and security function for mobile banking, a schedule management function, and an e-wallet function, are integrated in a single electronic device, in addition to a communication function.

Such electronic devices are capable of performing wireless communication by including an antenna device. For example, an electronic device may be provided with various antenna devices (e.g., an antenna device for near field communication (NFC), an electronic card, and the like, an antenna device for a connection of a local area network (LAN) and the like, or an antenna device for connection to a wireless communication network). As various antenna devices are mounted in a single electronic device as described above, with the advancement of electronic/information communication technologies, the electronic device may select a suitable antenna device according to the environment or an operating mode so as to secure an optimum communication environment.

However, in a miniaturized electronic device, such as a mobile communication terminal, it may be difficult to secure a space for arranging an antenna device. Furthermore, although it is necessary to arrange a plurality of antenna devices (or radiating conductors) in order to enable an electronic device to operate in a plurality of different frequency bands, it may be difficult to secure a space for installing such antenna devices in a miniaturized electronic device.

In addition, in an electronic device in which a metallic material is used as a case member in order to make the external appearance aesthetically desirable and to ensure shock resistance and the like, it may be difficult to secure the performance of an antenna device. For example, a case member made of a metallic material may be a filter to the transmission/reception of wireless signals using an antenna device.

SUMMARY

Thus, various aspects of the present disclosure are to provide an electronic device that includes antenna devices that facilitate the securing of a mounting space thereof and are simultaneously operable in a plurality of different frequency bands.

In addition, various aspects of the present disclosure provide an electronic device that includes antenna devices that are capable of suppressing the interference of different frequency bands while operating in a plurality of different frequency bands.

Further, various aspects of the present disclosure provide an electronic device that includes an antenna device that is capable of securing a stable wireless transmission/reception performance while making the external appearance aesthetically desirable with a case that is at least partially formed of a metallic material.

According to an aspect of the present disclosure, there is provided an electronic device that includes a case member that includes a first face, a second face that is opposite to the first face, and side walls that enclose a space between the first face and the second face, an elongated first metallic member that forms at least a portion of the side walls of the case member or is formed adjacent to the side walls, a metal pattern that is positioned within the case member and extends from one portion of the first metallic member to another portion of the first metallic member, the first metallic member and the metal pattern electrically forming at least a portion of a closed loop, a communication module that is electrically connected to a portion of the metal pattern, and a ground member positioned within the case member. At least a portion of the metal pattern may be disposed adjacent to the ground member.

In the electronic device as described above, when the wireless communication integrated circuit operates, an electromagnetic coupling may be formed between a portion of the metal pattern and the ground member, and an RF signal may be transmitted/received through the first metallic member.

According to an aspect of the present disclosure, an electronic device may make the external appearance aesthetically desirable by using a metallic material in a portion of the case member (e.g., the frame). Since a resonance frequency is formed in a plurality of different frequency bands by using a metallic material portion of the case member as a radiating conductor, the electronic device may include an antenna device that has a stable radiating function even if a separate mounting space is not secured. In addition, since the frame, which forms a portion of the case member, is partially split (by partially cutting the metallic material portion and insulating the metallic material portions from each other) such that each of a plurality of metallic material portions may be used as a radiating conductor, the electronic device is capable of performing wireless communication in various frequency bands. In addition, it is possible to secure an isolation between radiating conductors by disposing power feeding portions and ground-connecting portions to be distributed while securing the mechanical rigidity of the electronic device, by disposing a plurality of radiating conductors to be adjacent to each other.

BRIEF DESCRIPTION OF THE DRAWINGS

The above and other aspects, features, and advantages of certain embodiments of the present disclosure will be more apparent from the following detailed description taken in conjunction with the accompanying drawings, in which.

DETAILED DESCRIPTION

Figure 1:
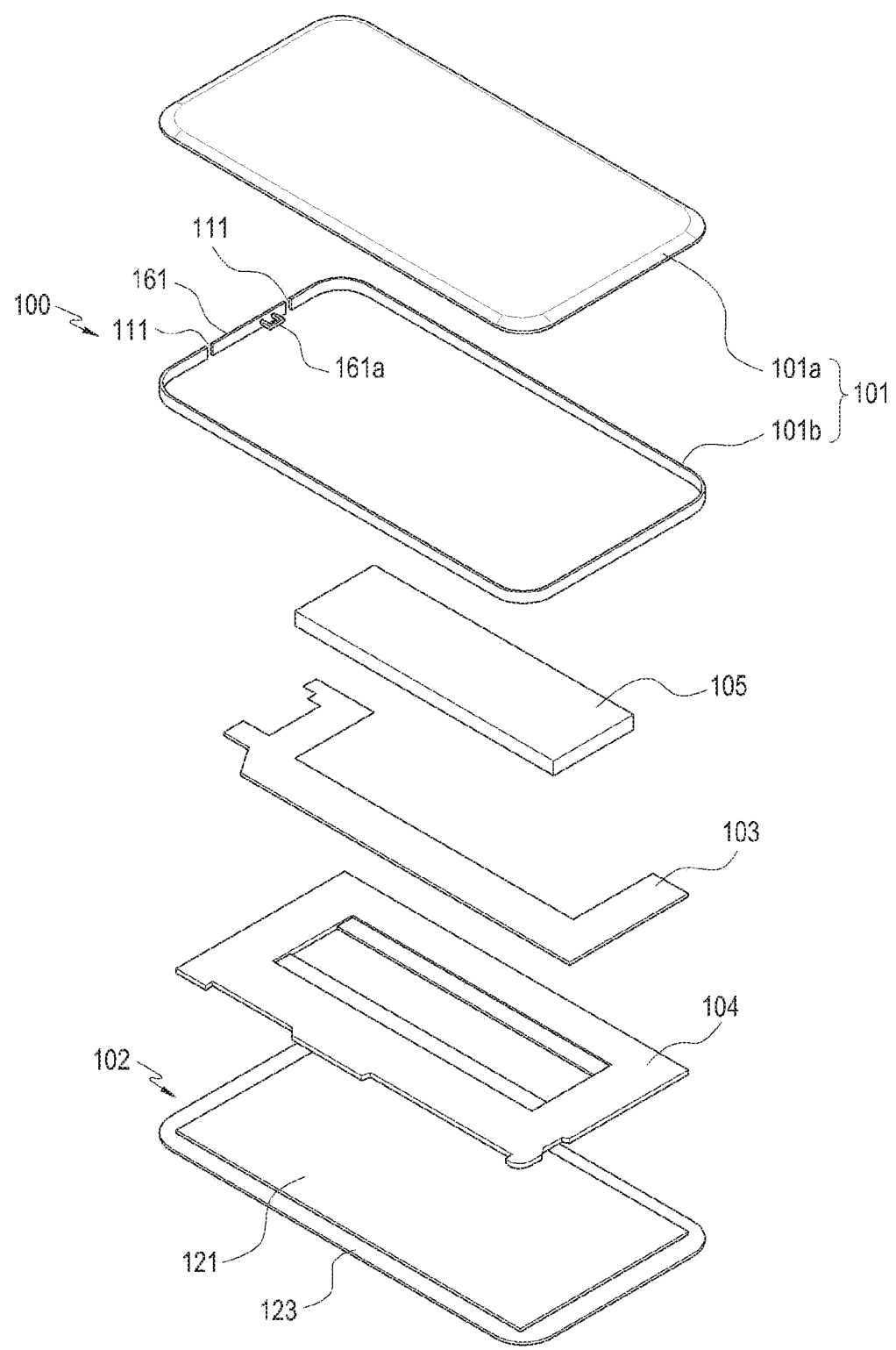
FIG. 1 is an exploded perspective view an electronic device according to an embodiment of the present disclosure.

Hereinafter, various embodiments of the present disclosure will be described with reference to the accompanying drawings. However, it should be understood that the present disclosure is not limited to the particular forms disclosed herein, rather, the present disclosure should be construed to cover various modifications, equivalents, and/or alternatives of embodiments of the present disclosure. In describing the drawings, similar reference numerals may be used to designate similar constituent elements.

In an embodiment of the present disclosure, the expressions "A or B", "at least one of A or/and B", or "one or more of A or/and B" may include all possible combinations of the items listed. For example, the expressions "A or B", "at least one of A and B", or "at least one of A or B" refer to all of (1) including at least one A, (2) including at least one B, or (3) including all of at least one A and at least one B.

The expressions "a first", "a second", "the first", or "the second" used in various embodiments of the present disclosure may modify various components regardless of the order and/or the importance but do not limit the corresponding components. For example, a first user device and a second user device indicate different user devices although both of them are user devices. For example, a first element may be referred to as a second element, and similarly, a second element may be referred to as a first element without departing from the scope of the present disclosure.

It should be understood that when an element (e.g., first element) is referred to as being (operatively or communicatively) "connected," or "coupled," to another element (e.g., second element), it may be directly connected or coupled to the other element or any other element (e.g., third element) may be interposed between them. In contrast, it may be understood that when an element (e.g., first element) is referred to as being "directly connected," or "directly coupled" to another element (second element), there are no elements (e.g., third element) interposed between them.

The expression "configured to" as used in the present disclosure may be interchangeably used with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g. embedded processor) only for performing the corresponding operations or a general-purpose processor (e.g., central processing unit (CPU) or application processor (AP)) that may perform the corresponding operations by executing one or more software programs stored in a memory device.

In the present disclosure, the terms are used to describe specific embodiments, and do not limit the present disclosure. As used herein, the singular forms are intended to include the plural forms as well, unless the context clearly indicates otherwise. In the description, it should be understood that the terms "include" or "have" indicate the existence of a feature, a number, a step, an operation, a structural element, parts, or a combination thereof, and do not exclude the existence or probability of addition of one or more other features, numeral, steps, operations, structural elements, parts, or combinations thereof.

Unless defined differently, all terms used herein, which include technical terms or scientific terms, have the same meaning as that understood by a person skilled in the art to which the present disclosure belongs. Such terms as those defined in a generally used dictionary are to be interpreted to have the meanings as the contextual meanings in the relevant field of art, and are not to be interpreted to have ideal or excessively formal meanings unless clearly defined in the present specification. In some cases, even the terms defined in the present disclosure should not be interpreted to exclude embodiments of the present disclosure.

In the present disclosure, an electronic device may be a random device, and the electronic device may be referred to as a terminal, a portable terminal, a mobile terminal, a communication terminal, a portable communication terminal, a portable mobile terminal, a display device and the like.

For example, the electronic device may be a smartphone, a portable phone, a game player, a TV, a display unit, a heads-up display unit for a vehicle, a notebook computer, a laptop computer, a tablet personal computer (PC), a personal media player (PMP), a personal digital assistant (PDA), and the like. The electronic device may be a portable communication terminal which has a wireless communication function and is pocket sized. Further, the electronic device may be a flexible device or a flexible display device.

The electronic device may communicate with an external electronic device, such as a server and the like, or perform an operation through an interworking with the external electronic device. For example, the electronic device may transmit an image photographed by a camera and/or position information detected by a sensor unit to the server through a network. The network may be a mobile or cellular communication network, a local area network (LAN), a wireless local area network (WLAN), a wide area network (WAN), the Internet, a small area network (SAN) etc., but is not limited thereto.

FIG. 1 is an exploded perspective view illustrating the electronic device 100 according to an embodiment of the present disclosure.

Referring to FIG. 1, the electronic device 100 includes a case member 101 having an opened front face and a display device 102 mounted on the front face of the case member, and a circuit board 103 and a battery 105 may be accommodated within the case member 101.

The case member 101 includes a conductive frame member 101b that is at least partially made of a metal material. According to an embodiment of the present disclosure, the entire case member 101 may be made of a metal material, or may be made by using a combination of a metal material and a synthetic resin. For example, a portion of the metal material may be made in advance, and then injection molding is performed in a state where the metal material portion is disposed within a mold for injection molding so as to integrally mold the metal material portion and the synthetic resin portion such that the case member 101 may be manufactured. The case member 101, the frame 101b, which forms the side wall, may be made of a conductive metal material and may be formed around one face of a rear member 101a.

When the case member 101 includes the metal material portion, it is possible to implement an aesthetically desirable design of a metal texture in the external appearance of the electronic device 100. In addition, the metal material portion reinforces the mechanical rigidity so that the rigidity of the electronic device 100 may be improved. As described above, however, the radiating performance of an antenna device may be degraded in an electronic device in which a metal material is used for the case member. According to an embodiment of the present disclosure, the degradation of the radiating performance of the antenna device, which is caused by the metal material portion of the case member 101, may be prevented by utilizing at least a portion of the frame 101b as the radiating conductor of the antenna device.

The frame 101b may be formed along the periphery of the rear member 101a, and may partially include a portion that is made of a metal material. The frame 101b includes split portions 111b such that at least two different portions are arranged to form a loop shape. The split portions 111 formed between two different portions of the frame 101b may be filled with a synthetic resin in the process of injection-molding the case member 101. In forming the split portion(s) 111 as described above, it is possible to secure the rigidity of the electronic device 100 (e.g., the case member 101) by properly setting the distance between the split portions 111. For example, if the split portions 111 are formed to be excessively close to each other, the case member 101 may be deformed by a force applied to a location away from the split portions 111. Accordingly, when the distance between the split portions 111 is properly spaced, it is possible to prevent the case member 101 from being deformed even if a force is applied to any location on the case member 101.

While a plurality of fastening structures are formed on the inner face of the frame 101b, the structures are omitted from the drawings. For example, in arranging the frame 101b integrally with the rear member 101a by insert injection molding, the case member 101 may include structures to enhance the fastening force between the frame 101b and the rear member 101a. The fastening structures may be formed on the inner face of the frame 101b, and by increasing the contact area between the frame 101b and the rear member 101a, the fastening force between the frame 101b and the rear member 101a may be increased.

The display device 102 includes a display element 121 configured to output a screen, and a window member 123 mounted on the front face of the case member 101 and configured to protect the display element 121. The window member 123 may be attached to the display element 121, and may transmit the screen output from the display element 121. The display device 102 may include a touch panel. For example, the touch panel may be disposed between the window member 123 and the display element 121 so that the display device 102 may provide a user input function.

The circuit board 103 is disposed within the case member 101, and may control operation of the electronic device 100. For example, a processor, a communication module, a memory, an audio module, and interface, and various sensor modules may be mounted on the circuit board 103, and through these, the electronic device 100 may perform the collection, storage, and input/output operations of various pieces of information. The circuit configuration of the electronic device 100 will be described in more detail with reference to FIGS. 18 and 19. While the present disclosure exemplifies the circuit board that is manufactured in a single structure it is not limited to such. Two, three or more circuit boards may be manufactured, and properly distributed and arranged within the case member 101.

The battery 105 is disposed within the case member 101, and may provide power that is required for operating the electronic device 100. The battery 105 may be configured to be replaceable according to the needs of the user. However, the replacement of the battery 105 by the user may be partially limited depending on the specification or the use environment of the electronic device 100.

The electronic device 100 includes a support member (e.g., bracket) 104 to reinforce the mechanical strength as well as to block electromagnetic wave interference between various electronic components within the case member 101. The support member 104 may support the display device 102 on the inner face of the display device 102 in order to prevent the display device 102 from being interfered with by other electronic components or from being deformed by external force. In addition, while FIG. 1 illustrates the support member 104 in a shape having a flat face, the support member 104 may include accommodation space(s) that corresponds to the electronic components disposed on the circuit board 103. For example, when the circuit board 103 is installed on the support member 104, the electronic components disposed on the circuit board 103 may be individually accommodated and isolated within an accommodation space formed in the support member 104, or adjacent electronic components may be accommodated or isolated in a single accommodation space. The structure, which accommodates the electronic components disposed on the circuit board 103 in the accommodation space of the support member 104, may be variously changed depending on the inner space environment of the electronic device 100. The support member 104 may provide a ground portion G (e.g., G of FIG. 10) inside the electronic device 100, and may include an electromagnetic wave shield material so as to block electromagnetic wave interference between the electronic components within the electronic device 100.

The electronic device 100 may include a ground portion G that is formed by a portion of a conductive layer formed on the circuit board 103 or a conductive layer formed on the support member 104. The ground portion G may improve the electric stability of the electronic device 100. According to an embodiment of the present disclosure, the ground portion G may also be implemented by forming a conductive layer, for example, on the inner face of the case member 101 (e.g., the rear member 101a), other than the circuit board 103 or the support member 104.

In the electronic device 100, a portion of the frame 101b, which is separated from another portion by the split portions 111, may be implemented as a portion of the antenna device, for example, as a first radiating conductor 161. For example, the first radiating conductor 161 may form a portion of the frame 101b while implementing a portion of the antenna device of the electronic device 100. While the present disclosure exemplifies a structure in which the first radiating conductor 161, which forms a portion of the antenna device, is a portion of the frame 101b, the present disclosure is not limited thereto. For example, in implementing the antenna device of the electronic device 100, the radiating conductor may be a component that is embedded in the electronic device 100. For example, the radiating conductor of the antenna device may be formed of a conductive pattern that is printed on, or attached to, a circuit board embedded in the electronic device 100 or a surface of a separate structure (e.g., a carrier). According to an embodiment of the present disclosure, another portion of the frame 101b may also implement another portion of the antenna device. The configuration of the antenna device will be described in more detail with reference to FIGS. 2 to 8.

Figure 2:
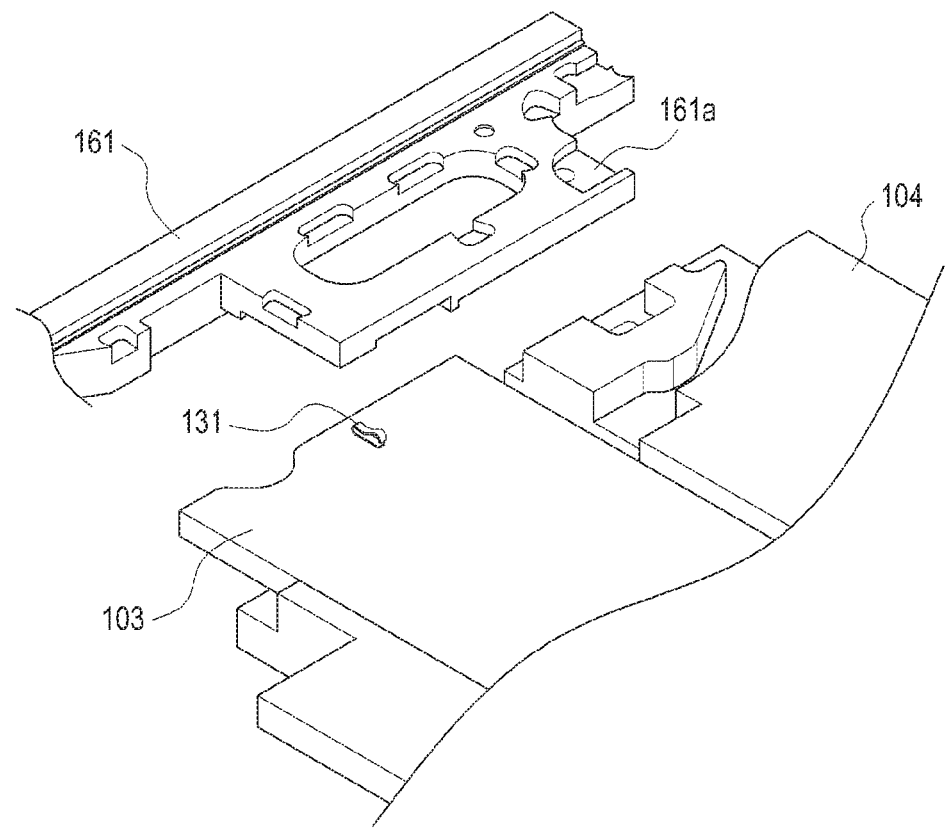
FIG. 2 is a perspective view illustrating a structure in which a first radiating conductor of an electronic device is disposed according to an embodiment of the present disclosure.
Figure 3:
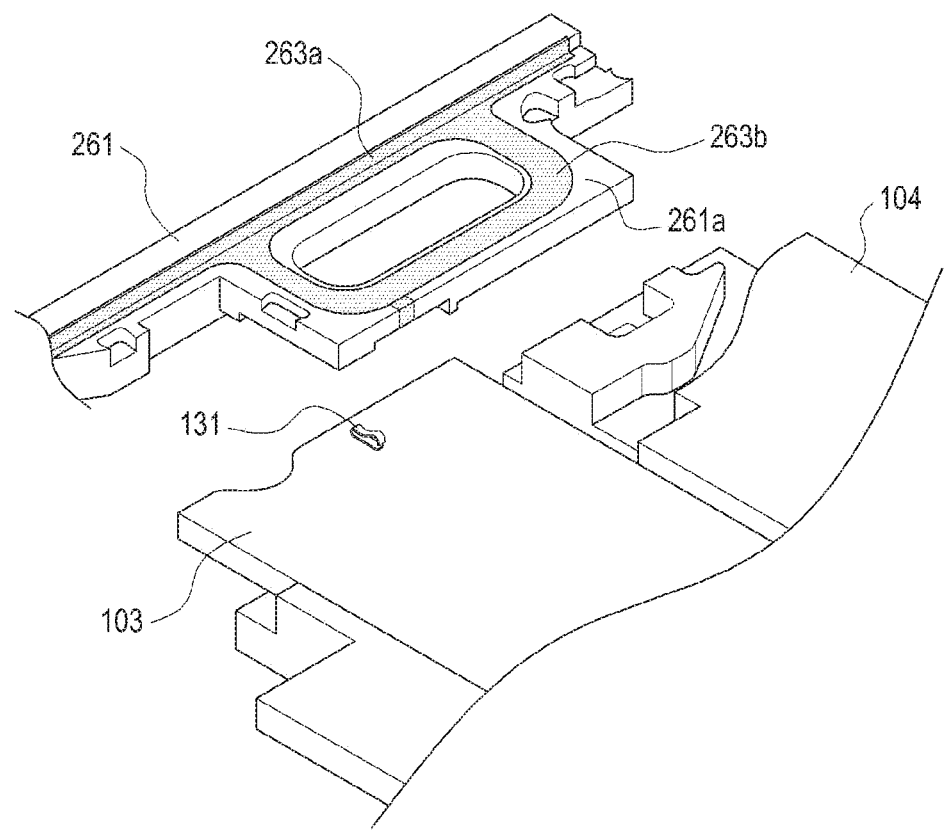
FIG. 3 is a perspective view illustrating a modification in which a first radiating conductor of an electronic device according to is disposed an embodiment of the present disclosure.
Figure 4:
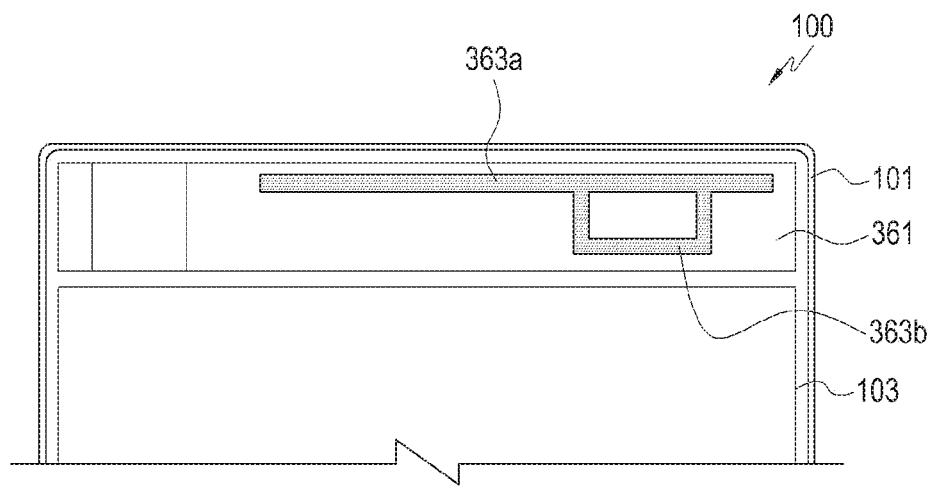
FIG. 4 is a plan view illustrating another modification in which a first radiating conductor of an electronic device is disposed according to an embodiment of the present disclosure.
Figure 5:
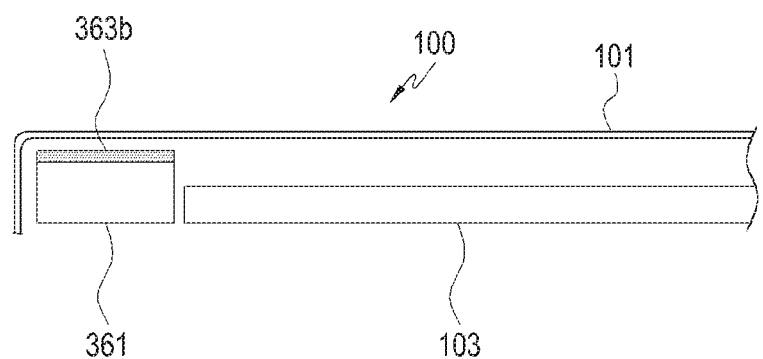
FIG. 5 is a side view illustrating another modification in which a first radiating conductor of an electronic device is disposed according to an embodiment of the present disclosure.
Figure 6:
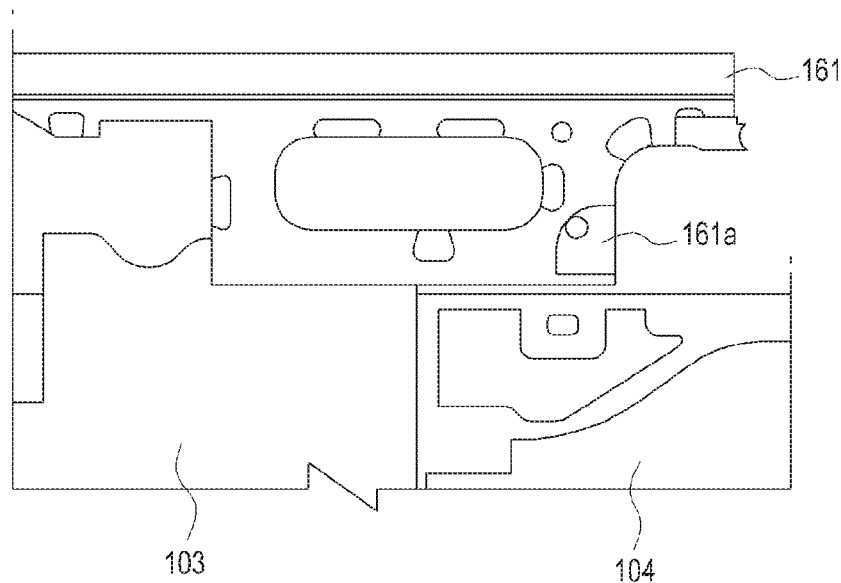
FIG. 6 is a plan view illustrating a configuration in which a first radiating conductor of an electronic device is disposed according to an embodiment of the present disclosure.
Figure 7:
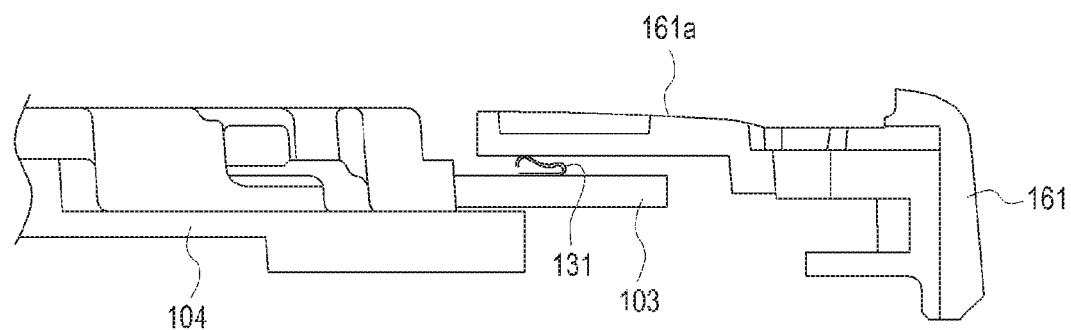
FIG. 7 is a side view illustrating a configuration in which a first radiating conductor of an electronic device is disposed according to an embodiment of the present disclosure.
Figure 8:
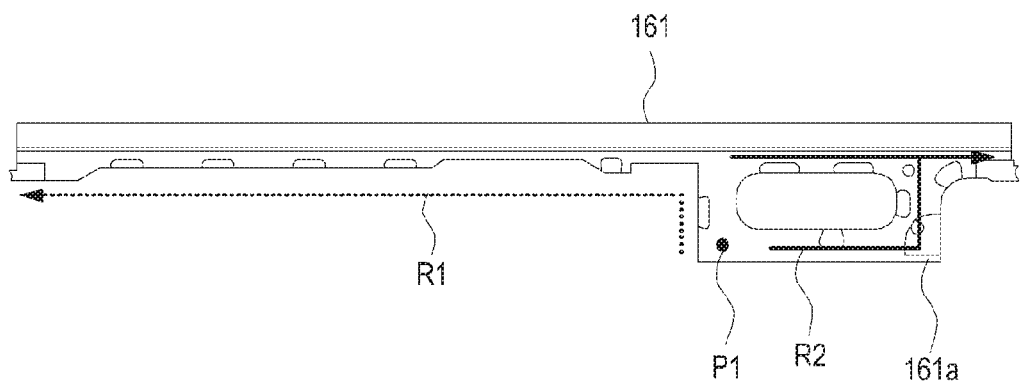
FIG. 8 is a plan view illustrating a first radiating conductor of an electronic device according to an embodiment of the present disclosure.

FIG. 2 is a perspective view illustrating a structure in which a first radiating conductor of an electronic device according to an embodiment of the present disclosure is disposed. FIG. 3 is a perspective view for illustrating a modification in which a first radiating conductor of an electronic device according to an embodiment of the present disclosure is disposed. FIG. 4 is a plan view illustrating another modification in which a first radiating conductor of an electronic device according to an embodiment of the present disclosure is disposed. FIG. 5 is a side view illustrating another modification in which a first radiating conductor of an electronic device 100 according to an embodiment of the present disclosure is disposed. FIG. 6 is a plan view illustrating a structure in which a first radiating conductor 161 of an electronic device 100 according to an embodiment of the present disclosure is disposed. FIG. 7 is a side view illustrating a structure in which a first radiating conductor 161 of an electronic device 100 according to an embodiment of the present disclosure is disposed. FIG. 8 is a plan view illustrating a first radiating conductor 161 of an electronic device 100 according to an embodiment of the present disclosure is disposed.

Referring to FIGS. 2 to 8, the first radiating conductor 161 includes a power feeding conductor 161a that is formed to inwardly protrude. The power feeding conductor 161a may form a closed loop shape together with a portion of the first radiating conductor 161. For example, the power feeding conductor 161a may have a fence shape that is connected to the inner face of the first radiating conductor 161. In addition, the power feeding conductor 161a may be utilized as a fastening structure that improves the fastening force between the frame 101b and the rear member 101a. For example, a portion of the rear member 101a may be molded to enclose at least a portion of the power feeding conductor 161a.

According to an embodiment of the present disclosure, a first radiating conductor of the electronic device 100 may be constructed with a conductor pattern that is bonded to a non-conductor by machining a conductive flat plate, or a conductor pattern that is formed by depositing, plating, or printing a conductive metal on a surface of a non-conductor.

Referring to FIG. 3, the first radiating conductor 161 of the above-described embodiment may be replaced by a structure that is fabricated from a non-conductive material (e.g., a carrier 261 made of an injection-molded material). When the electronic device 100 includes a carrier 261 made of a non-conductive material, the first radiating conductor 263a may be disposed on the carrier 261 through a bonding, depositing, plating, or printing process. In order to help describe the present embodiment, FIG. 3 exemplifies a configuration in which the first radiating conductor 263a is disposed on the surface of the carrier 261. However, the present disclosure, is not limited thereto. For example, the first radiating conductor 263a may be enclosed and concealed by a non-conductive material that forms the carrier 261. A portion of the first radiating conductor 263a may be disposed on the bottom face of the carrier 261. Similar to the preceding embodiment, the first radiating conductor 263a may be provided with a power feeding conductor 263b, and the carrier 261 may include a support 261a having a shape that corresponds to that of the power feeding conductor 263b. The shape of the support 261a is formed to support the power feeding conductor 263b, and the power feeding conductor 263b may form a closed loop shape together with a portion of the first radiating conductor 263a.

According to an embodiment of the present disclosure, the carrier may be installed within the electronic device 100. Referring to FIGS. 4 and 5, the carrier 361 of the electronic device 100 may be adjacent to one side edge within the case member 101 (e.g., the upper end or lower end in the case member 101). The carrier 361 may be fabricated from a non-conductive material (e.g., a synthetic resin, such as polycarbonate (PC)). A first radiating conductor 363a may be disposed on the outer peripheral surface of the carrier 361. Similar to the preceding embodiment, the first radiating conductor 363a may be bonded to the carrier 361 by machining a conductive flat plate, or by depositing, plating, or printing a conductive metal on the surface of the carrier 361. A power feeding conductor 363b may be further provided on the surface of the carrier 361. The power feeding conductor 363b may form a closed loop shape together with a portion of the first radiating conductor 363a, and may be positioned adjacent to the circuit board 103 within the case member 101. The power feeding conductor 363b may be fed with power through a connection terminal provided on the circuit board 103 (e.g., the above-described connection terminal 131), and may form an electromagnetic field coupling with a ground portion provided on the circuit board 103.

When the circuit board 103 is assembled to the case member 101 in the state where the circuit board 103 is installed on the support member 104, the power feeding conductor 161a may be arranged to be adjacent to the circuit board 103 or the support member 104 (e.g., a ground portion G implemented on the circuit board 103 or the support member 104). The power feeding conductor 161a may be disposed to face a portion of the circuit board 103. A connection terminal (e.g., a C-clip) 131 may be disposed on the circuit board 103 to be in contact with the power feeding conductor 161a. Through the connection terminal 131, the first radiating conductor 161 may be fed with power from a communication module that is disposed on the circuit board 103 to transmit/receive an RF signal.

Referring to FIG. 8, in forming the power feeding conductor 161a on the inner face of the first radiating conductor 161, the power feeding conductor 161a may be disposed to form first and second routes R1 and R2, which have different lengths. For example, the power feeding conductor 161a may be disposed to be closer to one side end of the first radiating conductor 161, and the connection terminal 131 may come in contact with an arbitrary first point P1 on the power feeding conductor 161a. When the connection terminal 131 is in contact with the first point P1, the first radiating conductor 161 may form a mono-pole antenna structure that forms an RF signal flow along the two different routes R1 and R2. For example, the first radiating conductor 161 may be fed with power through the connection terminal 131 and the power feeding conductor 161a, and an RF signal flow may be formed on the first route R1, which is formed along a portion of each of the power feeding conductor 161a and the first radiating conductor 161, and the second route R2, which is formed along another portion of each of the power feeding conductor 161a and the first radiating conductor 161. Depending on the position where the connection terminal 131 is in contact, the first and second routes R1 and R2 may have different lengths such that the first radiating conductor 161 may form a resonant frequency in a plurality of different frequency bands as a function of the length of the first radiating conductor 161.

In the first radiating conductor 161 having a mono-pole antenna structure, since it is possible to adjust the length of the first route R1 according to the position of the first point P1 where the connection terminal 131 is connected, the resonant frequency formed through the first route R1 (hereinafter, referred to as a "first resonant frequency") may be adjusted. When the first route R1 is independently fed with power, the resonant frequency formed through the second route (hereinafter, a "second resonant frequency") may be adjusted by adjusting the length of the second route R2 by forming an electromagnetic coupling between the power feeding conductor 161a and the ground portion. When the power feeding conductor 161a is not provided, the second route R2 may be omitted and the power may be fed in common with the first route R1. In such a case, by the multiplication resonance effect of the first route R1, the second resonant frequency may be formed in a large frequency band that is about twice the first resonant frequency R1. For example, if the first resonant frequency is formed in the 700 MHz band, the second resonant frequency may be formed in the 1.4 GHz band due to the multiplication resonance effect.

As the size of the electronic device 100 increases, the interval between the split portions 111 may also increase. For example, the length of the first radiating conductor 161 may further increase. This is because the positions of the split portions 111 are designed in consideration of, for example, the mechanical rigidity of the electronic device 100 (e.g., the case member 101) or the external appearance of the electronic device 100. With an antenna device operating at the same conditions, the resonant frequency becomes lower as the length of the radiating conductor (corresponding to the wavelength) increases.

Since the first resonant frequency may be adjusted according to a point where the first radiating conductor 161 is fed with power (e.g., the position of the point P1 where the connection terminal 131 is connected), the first resonant frequency may be designed to be in the frequency band in which the electronic device 100 transmits/receives an RF signal. Whereas, since the positions of the split portions 111 are designed in consideration of, for example, the mechanical rigidity or the external appearance (e.g., since it is difficult to adjust the length of the first radiating conductor 161 to be suitable for the requested specification of the antenna device), the second resonant frequency may be determined based on the multiplication resonance effect or the length of the second route R2. When the position P1, where the connection terminal 131 is in contact with the power feeding conductor 161a, is determined in order to secure the first resonant frequency, the length of the second route R2 may be determined. Accordingly, as the entire length of the first radiating conductor 161 increases (e.g., as the size of the electronic device 100 increases), the second resonant frequency may be formed in a lower frequency band.

A commercially available mobile communication network may be provided, for example, through a 699 to 960 MHz band (hereinafter, a "low frequency band"), a 1.7 to 2.1 GHz band (hereinafter, a "middle frequency band"), and a 2.10 to 2.07 GHz band (hereinafter, a "high frequency band"), so that part of the frequency bands (e.g., the low frequency band) will be used in such a mobile communication network with the first radiating conductor 161 itself. For example, if the first resonant frequency was secured in the 700 MHz Band by using the first radiating conductor 161, the second resonant frequency is formed in the 1.4 GHz band, so that the first radiating conductor 161 will be connected to the commercial communication network through the low frequency band. Recently, carrier aggregation (CA) technology has been introduced so that communication may be simultaneously performed in a plurality of different frequency bands, thereby implementing a high speed and high capacity wireless communication. According to an embodiment of the present disclosure, the first radiating conductor 161 may form a resonant frequency in the above-mentioned middle frequency band by an electromagnetic coupling that is formed between the power feeding conductor 161a and the ground portion G. For example, an electronic device 100 may perform a high speed and high capacity wireless communication based on, for example, the CA technology through the first radiating conductor.

The power feeding conductor 161a may be arranged to be adjacent to the ground portion G that is provided through the circuit board 103 and/or the support member 104. By being adjacent to the ground portion G, the power feeding conductor 161a forms an electromagnetic coupling with the ground portion G, thereby forming the second resonant frequency in the middle frequency band. For example, the resonant frequency formed by an RF signal flowing along the second route R2 may be shifted to the middle frequency band through the electromagnetic coupling between the power feeding conductor 161a and the ground portion G. In order to increase the electromagnetic coupling amount or efficiency, the power feeding conductor 161a is spaced apart from the ground portion G, but may be partially arranged at a distance within 1 mm from the ground portion G. The configuration of shifting the second resonance frequency to the middle frequency band in the first radiating conductor 161 will be described in more detail with reference to FIG. 15.

Figure 9:
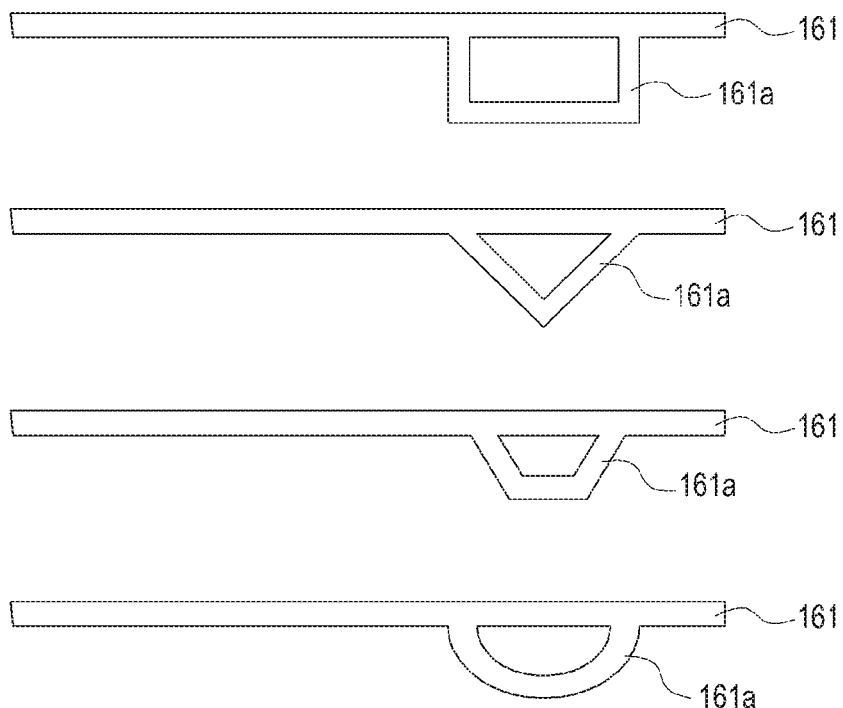
FIG. 9 is a view illustrating various modifications of a first radiating conductor, in an electronic device according to an embodiment of the present disclosure.

FIG. 9 is a plan view for illustrating various modifications of the first radiating conductor in an electronic device according to an embodiment of the present disclosure. Although FIG. 9 exemplifies a closed loop shape, which is formed by the power feeding conductor 161a, or the power feeding conductor 161a and a portion of the first radiating conductor 161, as a quadrangular shape, but the present disclosure is not limited thereto.

Referring to FIG. 9, the closed loop shape, which is formed by the power feeding conductor 161a, or the power feeding conductor 161a and a portion of the first radiating conductor 161, may be a polygonal shape or a shape that forms a portion of a circular or oval shape. As described above, the shape or size of the power feeding conductor 161a may be varied in consideration of an electromagnetic coupling efficiency with the ground portion G or a frequency band where the second resonant frequency is to be formed.

Figure 10:
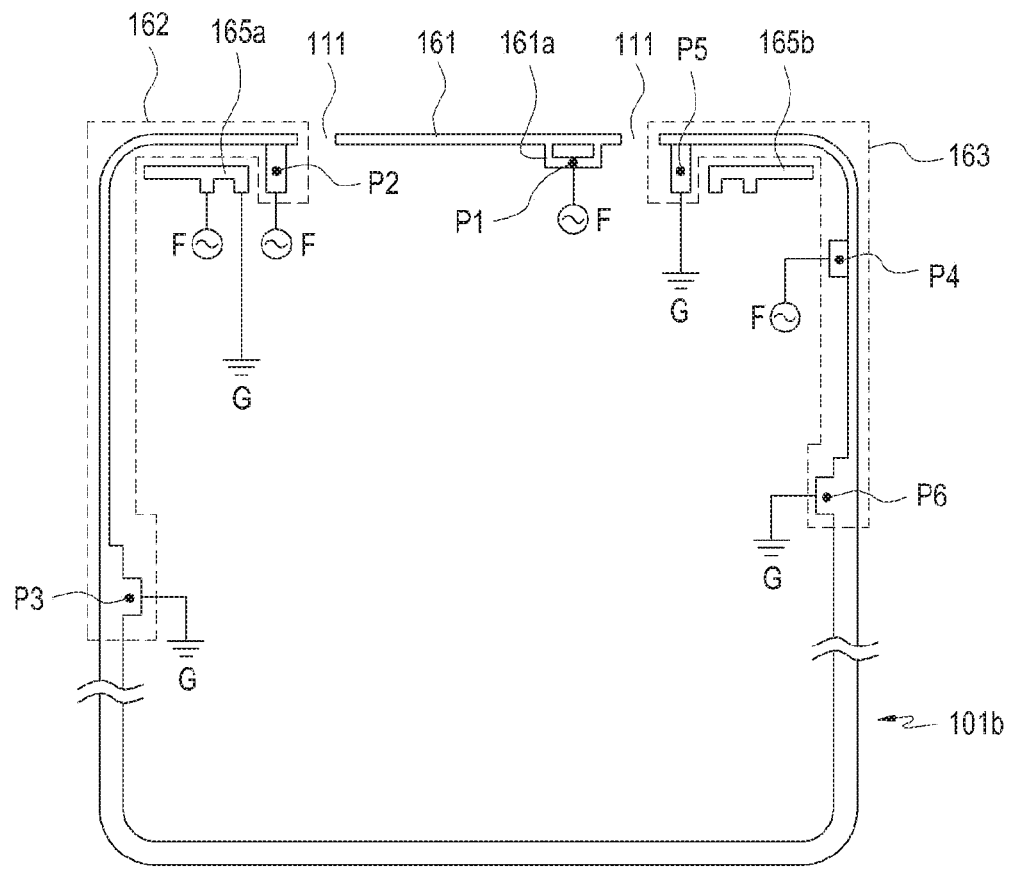
FIG. 10 is a view schematically illustrating an antenna device of an electronic device according to an embodiment of the present disclosure.

FIG. 10 is a view schematically illustrating an antenna device of an electronic device according to an embodiment of the present disclosure. FIGS. 11 to 14 are circuit diagrams each illustrating an antenna device of an electronic device according to an embodiment of the present disclosure.

Figure 11:
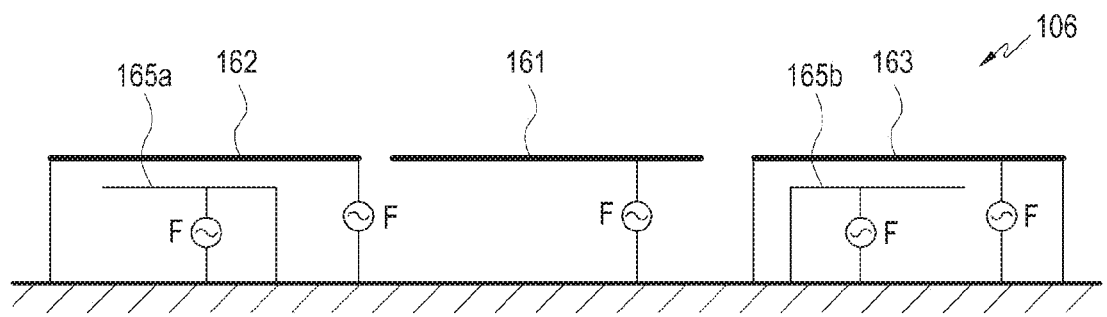
FIG. 11 is a circuit diagrams illustrating an antenna device of an electronic device according to an embodiment of the present disclosure.

Referring to FIGS. 10 and 11, the antenna device 106 of the electronic device 100 may use the entire or a portion of the frame 101b as a radiating conductor, and may further include radiating conductors separately from the frame 101b.

As described above, while forming a portion of the frame 101b, the first radiating conductor 161 may be in contact with the connection terminal 131 through the power feeding conductor 161a at the first point P1, thereby being fed with power F. The first radiating conductor 161 may be fed with the power F so as to form first and second resonant frequencies. The first resonant frequency may be adjusted depending on the contact position of the connection terminal 131, and the second resonant frequency may be adjusted by using the electromagnetic coupling between the power feeding conductor 161a and the ground portion G.

The antenna device 106 may include second radiating conductor(s) 162 and 163 disposed at one side or on opposite sides of the first radiating conductor 161, respectively. Between the first radiating conductor 161 and the second radiating conductor(s) 162 and 163 (e.g., in the split portion 111), a non-metallic material may be interposed so as to electrically insulate the first radiating conductor 161 and the second radiating conductor(s) 162 and 163 from each other. The non-metallic material may be a portion of the rear member 101a. The second radiating conductor(s) 162 and 163 may form another portion of the frame 101b, and may transmit/receive an RF signal by being fed with the power F from the electronic device 100. The second radiating conductor(s) 162 and 163 may be disposed to be adjacent to any end of the first radiating conductor 161, for example, at one side or at the other side of the first radiating conductor 161, with one of the split portions 111 being interposed therebetween.

The remaining portion of the frame 101b, excluding the first radiating conductor 161, may be integrally formed, and the second radiating conductor(s) 162 and 163 may be a portion of the remaining portion of the frame 101b, excluding the first radiating conductor 161. For example, the second radiating conductor(s) 162 and 163 may be implemented by disposing a point to be connected to the power F and a portion to be connected to the ground portion G on the frame 101b. In an embodiment of the present disclosure, the second radiating conductors 162 and 163 are disposed at the opposite sides of the first radiating conductor 161, respectively, and may form a loop antenna or a slot antenna depending on the point connected to the power F or the point connected to the ground portion G.

For example, when the power is provided at the second point P2 on the frame 101b at the left side of the first radiating conductor 161, and the third point P3 is connected to the ground portion G on the frame 101b, the portion of the frame 101b between the second and third points P2 and P3 may form the second radiating conductor 162. The second radiating conductor 162, which is disposed at the left side of the first radiating conductor 161, may have a loop antenna structure. For example, the opposite ends of the second radiating conductor 162 of the left side may be connected to the power feeding portion and the ground portion G, respectively, thereby forming the loop antenna structure.

The second radiating conductor 163 disposed at the right side of the first radiating conductor 161 may be fed with the power F, for example, at a fourth point P4 on the frame 101b, and may be connected to the ground portions G at fifth and sixth points, P5 and P6, that are spaced apart from each other to the opposite sides of the fourth points P4, respectively. For example, the portion of the frame 101b between the fifth and sixth points P5 and P6 may form the second radiating conductor 163 of the right side. When the second radiating conductor 163 of the right side and the ground portion G are connected to each other to form a slot, and the power F is fed to the fourth point P4 across the slot, a slot antenna structure including the second radiating conductor 163 may be formed at the right side of the first radiating conductor 161.

The second radiating conductor(s) 162 and 163 may be disposed at one side of the first radiating conductor 161 or the opposite sides of the first radiating conductor 161, respectively, to form a loop antenna structure or a slot antenna structure. In addition, the interference between the first and second radiating conductors 161, 162, and 163 may be suppressed by disposing the radiating conductors, which form resonant frequencies at different frequency bands, respectively, to be adjacent to each other. For example, an isolation may be secured between the first and second radiating conductors 161, 162, and 163 depending on the arrangement of the point where the power F is fed to the first and second radiating conductors 161, 162, and 163, or a point where the first and second radiating conductors 161, 162, and 163 are connected to the ground portion G.

According to an embodiment of the present disclosure, the performance of the antenna device 106 or the isolation between the first and second radiating conductors 161, 162, and 163 may be secured by using the arrangement of the portion(s) where signal power may be concentrated or the portion(s) where the power F is fed. The second radiating conductor 162 on the left side may be fed with the power F at one end that is adjacent to one end of the first radiating conductor 161, and may be connected to the ground portion G at the other end. The second radiating conductor 163 on the right side may be disposed such that one end connected to the ground portion G is adjacent to the other end of the first radiating conductor 161. The second radiating conductor 163 on the right side may be disposed to be closer to the power feeding conductor 161a than the second radiating conductor 162 on the left side.

In an embodiment of the present disclosure, while a structure, which allows the second radiating conductors 162 and 163 to be fed with the power F or to be connected to the ground portion G, is not specifically illustrated, this may be understood through the structure of the first radiating conductor 161. For example, structures for improving a fastening force with the rear member 101a may protrude from the inner faces of the second radiating conductors 162 and 163, and the connection terminal 131 disposed on, for example, the circuit board 103 may be in contact with the structures formed on the inner faces of the second radiating conductors 162 and 163.

According to an embodiment of the present disclosure, the electronic device 100 may secure an isolation between the respective radiating conductors by disposing a plurality of radiating conductors to be adjacent to each other while disposing the power feeding points of the respective radiating conductors to be distant from each other in configuring the antenna device 106. In addition, when an end of the second radiating conductors 162 and 163, which is disposed adjacent to any one end of the first radiating conductor 161, is connected to the ground portion G to form a slot antenna structure (or a loop antenna structure), it is possible to alleviate or improve the interference between the two radiating conductors.

According to an embodiment of the present disclosure, the electronic device 100 may further include third and fourth radiating conductors separately from the first and second radiating conductors 161, 162, and 163. For example, the third radiating conductors 165 and 165b may be disposed inside the loop or slot regions formed by the second radiating conductors 162 and 163, respectively. The third radiating conductors 165a and 165b may be implemented by using conductor patterns formed on a flexible printed circuit board, and may be connected to the ground portion G while being fed with power from the electronic device 100. The third radiating conductors 165a and 165b as described above may form an inverted f antenna (IFA) structure. In addition, when the inner space of the electronic device 100 allows, other radiating conductors may be disposed in other positions or spaces within the case member 101 separately from the first, second, and third radiating conductors 161, 162, 163, 165a, and 165b, so as to transmit/receive an RF signal.

The above-mentioned radiating conductors may be individually fed with power or may be individually connected to ground. However, the present disclosure is not limited thereto. For example, the above-mentioned radiating conductors 161, 162, 163, 165a, and 165b may be individually fed with power, and may be provided with a common ground. In addition, for example, the above-mentioned radiating conductors 161, 162, 163, 165a, and 165b may be fed with common power, and may be individually provided with ground. In addition, for example, some of the above-mentioned radiating conductors 161, 162, 163, 165a, and 165b may be provided with common power and common ground, and the remaining radiating conductors may be individually provided with power.

Figure 12:
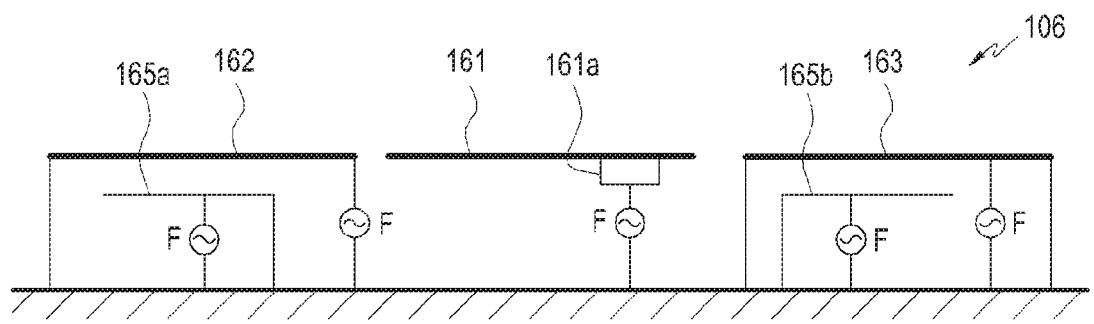
FIG. 12 is a circuit diagrams illustrating an antenna device of an electronic device according to another embodiment of the present disclosure.
Figure 13:
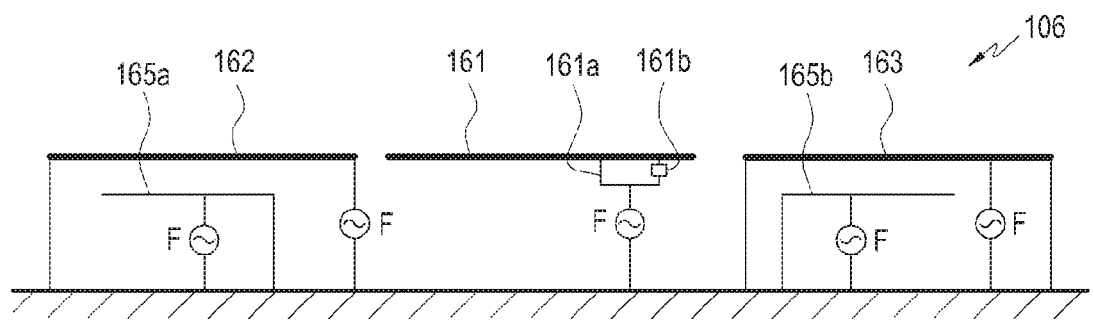
FIG. 13 is a circuit diagrams illustrating an antenna device of an electronic device according to another embodiment of the present disclosure.
Figure 14:
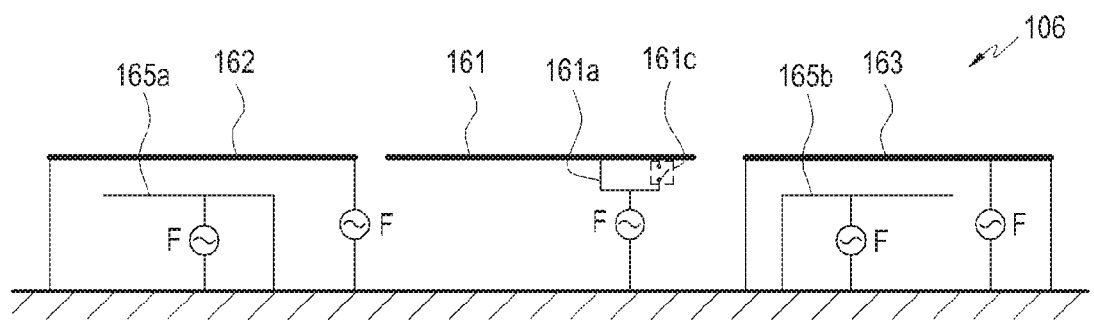
FIG. 14 is a circuit diagrams illustrating an antenna device of an electronic device according to another embodiment of the present disclosure.

FIGS. 12 to 14 illustrate various modifications that provide power (F) (or ground) to be provided to the first radiating conductor 161.

As described above, the first radiating conductor 161 may be fed with the power F through the power feeding conductor 161a. In addition, the power feeding conductor 161a may include, for example, a lumped element, a matching circuit, a resonance circuit, or a switch element. For example, an additional component may be disposed on the power feeding conductor 161a to implement the impedance matching of the first radiating conductor 161 or to adjust the radiating characteristic of the first radiating conductor 161.

FIG. 12 illustrates in more detail the antenna device 106 that includes the power feeding conductor 161a having the above-mentioned structure. FIG. 13 exemplifies a structure in which a circuit portion 161b is disposed on the power feeding conductor 161a. The circuit portion 161b may include at least one of a resistive element, a capacitive element, and an inductive element. According to an embodiment of the present disclosure, the circuit portion 161b may include an impedance matching circuit or an L/C resonance circuit.

FIG. 14 exemplifies a structure in which a switching element 161c is disposed on the power feeding conductor 161a. Depending on the ON/OFF operation of the switch element 161c, the routes formed through the power feeding conductors 161a may be changed. For example, when the switch element 161c is in the ON state, the first radiating conductor having the structure indicated by "S1" or "S2" in FIG. 15 may be implemented, and when the switch element 161c is in the OFF state, the first radiating conductor indicated by "S3" in FIG. 15 may be implemented. The changes in radiating characteristic according to the ON/OFF operation of the switch element 161c will be described in more detail with reference to FIGS. 15 to 17.

Figure 15:
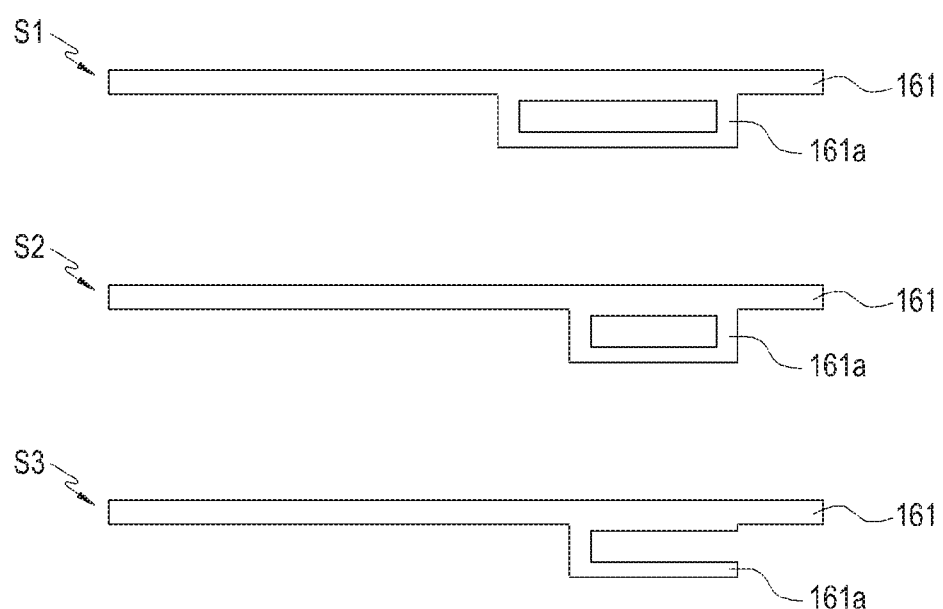
FIG. 15 is a view illustrating the shape of the first radiating conductor in an electronic device according to an embodiment of the present disclosure.
Figure 16:
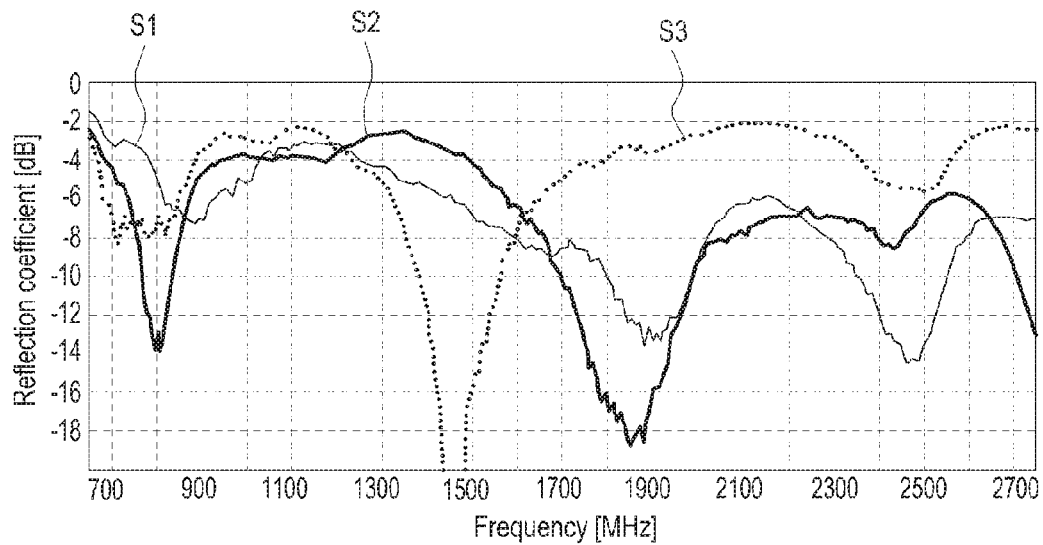
FIG. 16 is a graph representing reflection coefficients measured from the first radiating conductors illustrated in FIG. 15.
Figure 17:
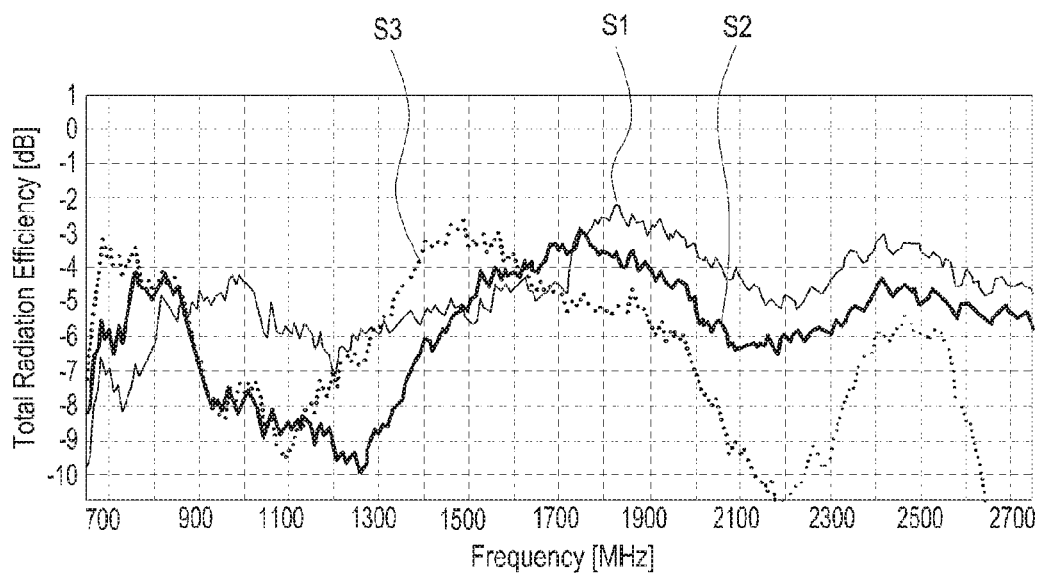
FIG. 17 is a graph representing radiating efficiencies measured from the first radiating conductors illustrated in FIG. 15.

FIG. 15 is a view illustrating the shape of the first radiating conductor in an electronic device according to an embodiment of the present disclosure. FIG. 16 is a graph representing reflection coefficients measured from the first radiating conductors illustrated in FIG. 15. FIG. 17 is a graph representing radiating efficiencies measured from the first radiating conductors illustrated in FIG. 15.

FIG. 15 illustrates structures obtained by modifying the first radiating conductor 161 (e.g., the power feeding conductor 161a). The illustrated shapes vary the radiating characteristics of the first radiating conductor 161 according to the modification of the power feeding conductor 161a. FIG. 15 exemplifies first and second shapes S1 and S2 that have structures obtained by changing the size of the power feeding conductor 161a, respectively, and third shape S3 in which the power feeding conductor 161a is not formed in a closed loop shape, but is open at one side. FIGS. 16 and 17 represent a change in radiating characteristics of the first radiating conductor 161 according to a change in shape, as described above.

Referring to FIGS. 16 and 17, the first radiating conductor 161 having the first shape S1 forms a first resonant frequency in the 900 MHz band and a second resonant frequency in the 1.9 GHz band. As compared to the first shape S1, the first radiating conductor 161 of the second shape S2 has a shape in which the size of the power feeding conductor 161a is reduced and the power feeding conductor 161a is disposed away from the left end of the first radiating conductor 161 by the reduced size thereof. The first radiating conductor 161 having the second shape S2 forms a first resonant frequency in the 800 MHz band and a second resonant frequency in the 1.85 GHz band. For example, as compared with the first shape S1, the resonant frequency of the low frequency band is adjusted as the electric route, which extends from the power feeding conductor 161a to the left end of the first radiating conductor 161, is lengthened. However, it may be seen that, even with such a change in shape, the second resonant frequency in the middle frequency band of 1.7 to 1.9 GHz exhibits a relatively small change.

The first radiating conductor 161 of the third shape S3 includes a power feeding conductor 161a, one side of which is open. When the power feeding conductor 161a is formed in such a shape, the electromagnetic coupling efficiency with the ground portion G may be reduced. As the electromagnetic coupling efficiency is reduced between the power feeding conductor 161a and the ground portion G, the multiplication resonance effect may increase in the first radiating conductor 164 of the third shape S3. For example, the second resonant frequency may be formed in a frequency band that is about twice that of the first resonant frequency.

According to an embodiment of the present disclosure, depending on the ON/OFF operation of the above-mentioned switch element 161c (see FIG. 14), the shape of the first radiating conductor 161 (e.g., the shape of the power feeding conductor 161a) may vary to change the resonant frequency characteristic or efficiency. For example, in the case where the switch element 161c is in the ON state, the first radiating conductor 161 may be implemented in the above-mentioned second shape S2, and in the case where the switch element 161c is in the OFF state, the first radiating conductor 161 may be implemented in the above-mentioned third shape S3. For example, as illustrated in FIGS. 16 and 17, the resonant frequency, the radiating efficiency, and the like in the low frequency band and the middle frequency band may be adjusted according to the ON/OFF operation of the switch element 161c.

Figure 18:
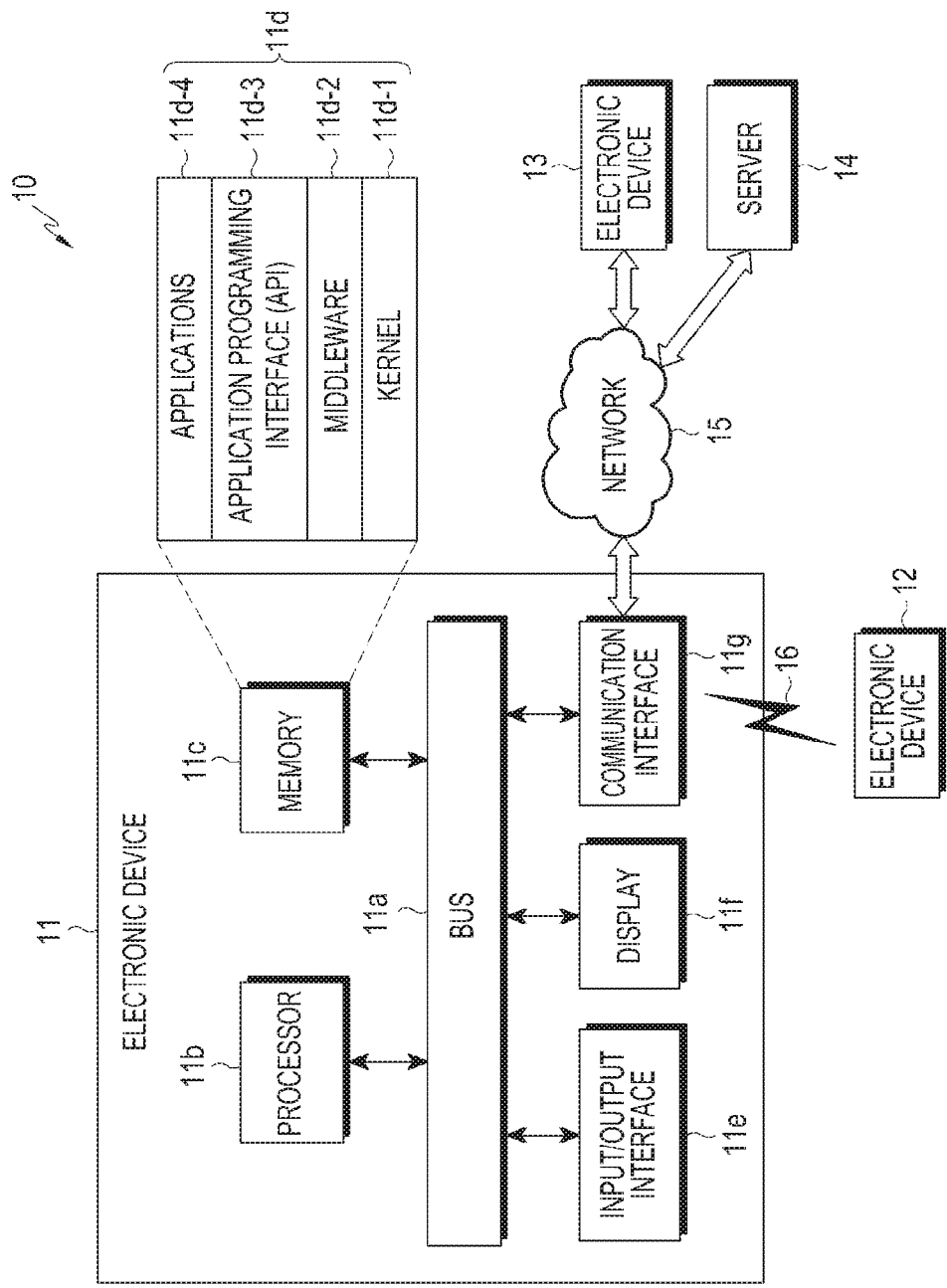
FIG. 18 is a view illustrating an electronic device in a network environment according to an embodiment of the present disclosure.

FIG. 18 is a view illustrating an electronic device in a network environment according to an embodiment of the present disclosure.

Descriptions will be made on an electronic device 11 within the network environment 10 in with reference to FIG. 18. The electronic device 11 or an external electronic device 12 or 13 to be described later, may include the above-mentioned electronic device 100. The electronic device 11 include a bus 11a, a processor 11b, a memory 11c, an input/output interface 11e, a display 11f, and a communication interface 11g. The electronic device 11 may omit at least one of the above-mentioned components or may additionally include other components.

The bus 11a may include, for example, a circuit that connects the above-mentioned components 11a to 11g and transmits communication (e.g., a control message and/or data) between the components.

The processor 11b may include one or more of a central processing unit (CPU), an application processor (AP), and a communication processor (CP). The processor 11b may execute, for example, an arithmetic operation or data processing that is related to a control and/or communication of one or more other components of the electronic device 11.

The memory 11c may include a volatile memory and/or a non-volatile memory. The memory 11c may store, for example, commands or data that are related to one or more other components of the electronic device 11. The memory 11c stores software and/or a program 11d. The program 11d includes a kernel 11d-1, a middleware 11d-2, an application programming interface (API) 11d-3, and/or an application program (or an "application") 11d-4. At least one of the kernel 11d-1, the middleware 11d-2, and the API 11d-3 may be referred to as an operating system (OS).

The kernel 11d-1 may control or manage, for example, system resources (e.g., the bus 11a, the processor 11b, or the memory 11c) that are used for executing operations or functions implemented in the other programs (e.g., the middleware 11d-2, the API 11d-3, or the application programs 11d-4). In addition, the kernel 11d-1 may provide an interface that allows the middleware 11d-2, the API 11d-3, or the application program 11d-d to access individual components of the electronic device 11 so as to control or manage the system resources.

The middleware 11d-2 may play an intermediary role such that, for example, the API 11d-3 or the application programs 11d-4 may communicate with the kernel 11d-1 so as to exchange data.

In addition, the middleware 11d-2 may process one or more task requests according to priority. For example, the middleware 11d-2 may assign the priority to be capable of using a system resource of the electronic device 11 (e.g., the bus 11a, the processor 11b, or the memory 11c) to at least one application program 11d-4. For example, the middleware 11d-2 may perform scheduling, load balancing, and the like for the one or more task requests by processing the one or more requests according to the assigned priority.

The API 11d-3 is, for example, an interface that allows the application program 11d-4 to control functions provided from the kernel 11d-1 or the middleware 11d-3, and may include, for example, one or more interfaces or functions (e.g., commands) for a file control, a window control, an image processing, or a character control.

The input/output interface 11e may serve as an interface to transmit commands or data, which are entered from, for example, a user or any other external device, to the other component(s) of the electronic device 11. Also, the input/output interface 11e may output commands or data, which are received from the other component(s) of the electronic device 11, to the user or the other external device.

The display 11f may include, for example, a liquid crystal display (LCD), a light emitting diode (LED) display, an organic light emitting diode (OLED) display, or a microelectromechanical systems (MEMS) display, or an electronic paper display. The display 11f may display various content (e.g., text, image, video, icon, or symbol) to, for example, the user. The display 11f may include a touch screen, and may receive a touch input, a gesture input, a proximity input, or a hovering input that is made using, for example, an electronic pen or a part of the user's body.

The communication interface 11g may set, for example, communication between the electronic device 11 and an external device 12, a second external device 13, or a server 14. For example, the communication interface 11g may communicate with the external device 12, the second external electronic device 13 or the server 14 by being connected with a network 15 through wired or wireless communication.

The wireless communication may use at least one of, for example, Long-term evolution (LTE), LTE advance (LTE-A), code division multiple access (CDMA), wideband CDMA (WCDMA), universal mobile telecommunication system (UMTS), wireless broadband (WiBro), or global system for mobile communication (GSM), as a cellular communication protocol. In addition, the wireless communication may include, for example, short range communication 16. The short range communication 16 may include at least one of, for example, wireless fidelity (WiFi), near field communication (NFC), and global navigation satellite system (GNSS). GNSS may include, for example, at least one of global positioning system (GPS), global navigation satellite system (Glonass), Beidou navigation satellite system (hereinafter, "Beidou"), Galileo, and the European global satellite-based navigation system according to, for example, a use area or bandwidth. Herein, "GPS" may be interchangeably used with "GNSS" below. The wired communication may use at least one of, for example, universal serial bus (USB), high definition multimedia interface (HDMI), recommended standard 232 (RS-232), and plain old telephone service (POTS). The network 15 may include a telecommunication network (e.g., at least one of a computer network (e.g., LAN or WAN), the internet, and a telephone network).

Each of the first and second external electronic devices 12 and 13 may be a type of device that is the same as or different from the electronic device 11. The server 14 may include a group of one or more servers. All or some of the operations to be executed by the electronic device 11 may be executed by another electronic device or a plurality of other electronic devices 12 and 13 or the server 14. In the case where the electronic device 11 should perform a certain function or service automatically or by a request, the electronic device 11 may request some functions or services that are associated therewith from the other electronic devices 12 and 13 or the server 14, instead of or in addition to executing the functions or service by itself. The other electronic devices 12 and 13 or the server 14 may execute the requested functions or additional functions, and may transmit the results to the electronic device 11. The electronic device 11 may provide the requested functions or services by processing the received results as they are or additionally. For this purpose, for example, a cloud computing technique, a distributed computing technique, or a client-server computing technique may be used.

Figure 19:
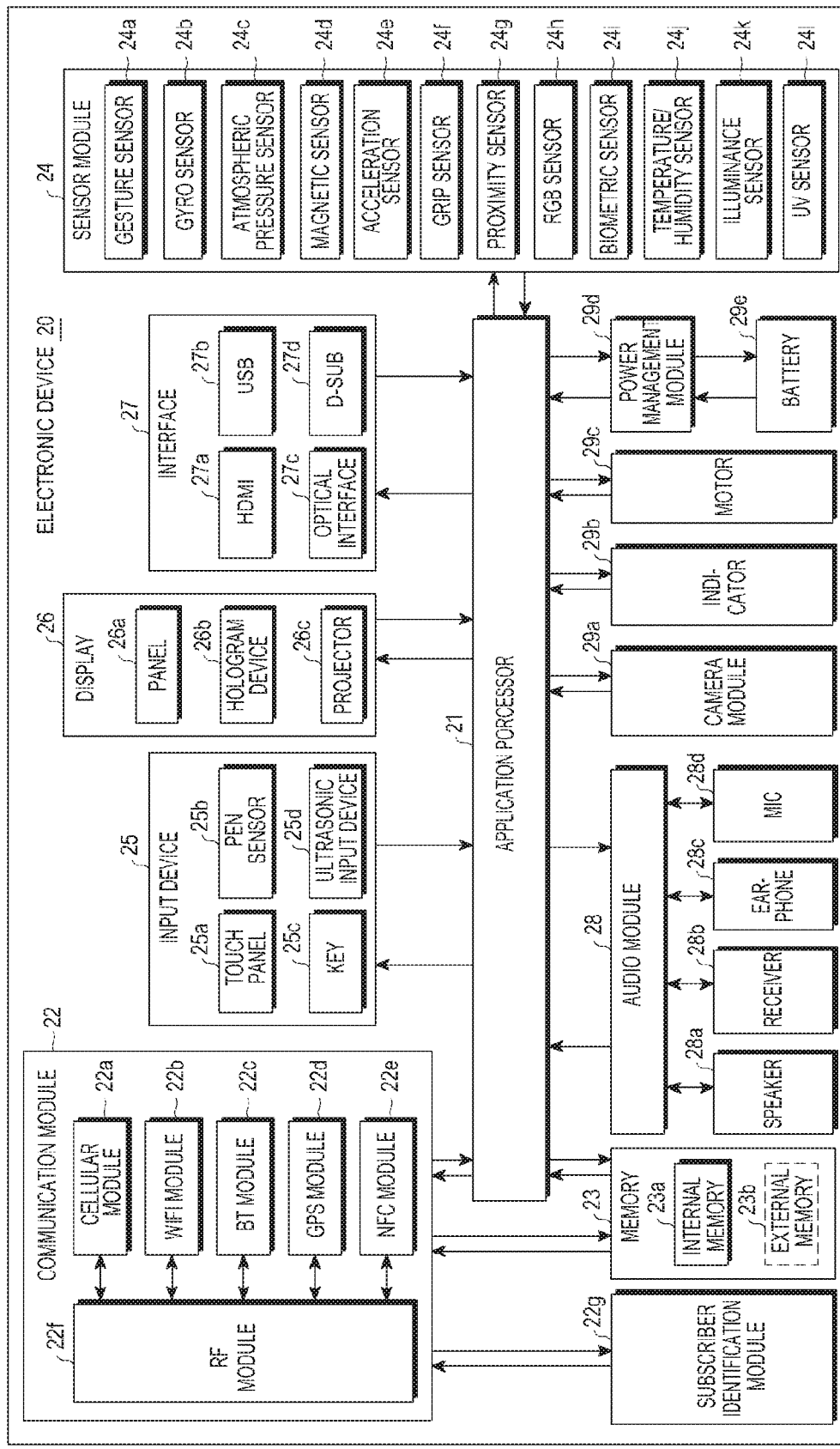
FIG. 19 is a block diagram illustrating an electronic device according to an embodiment of the present disclosure.

FIG. 19 is a block diagram illustrating an electronic device according to an embodiment of the present disclosure.

Referring to FIG. 19, the electronic device 20 may include, for example, the entirety or a portion of the electronic device 11 illustrated in FIG. 18. The electronic device 20 includes at least one application processor (AP) 21, a communication module 22, a subscriber identification module 22g, a memory 23, a sensor module 24, an input device 25, a display 26, an interface 27, an audio module 28, a camera module 29a, a power management module 29d, a battery 29e, an indicator 29b, and a motor 29c.

The AP 21 may drive, for example, an operating system or an application program so as to control a plurality of hardware or software components connected thereto, and may also perform various data processing and arithmetic operations. The AP 21 may be implemented by, for example, a system-on-chip (SoC). The AP 21 may further include a graphic processing unit (GPU) and/or an image signal processor. The AP 21 may include at least some components (e.g., the cellular module 22a) among the components illustrated in FIG. 19. The AP 21 may load a command or data received from at least one of the other components (e.g., a non-volatile memory) in a volatile memory to process the command and data, and may store various data in a non-volatile memory.

The communication module 22 may have a configuration that is the same as or similar to the communication interface 11g of FIG. 18. The communication module 22 includes a cellular module 22a, a WiFi module 22b, a Bluetooth module 22c, a GNSS module 22d (e.g., GPS module, Glonass module, Beidou module, or Galileo module), an NFC module 22e, and a radio frequency (RF) module 22f.

The communication module 22 may be electrically connected to an antenna device illustrated in, for example, FIG. 1 (e.g., the first radiating conductor 161 or the power feeding conductor 161a).

The cellular module 22a may provide, for example, a voice call, a video call, a message service, or an Internet service through, for example, a communication network. The cellular module 22a may perform discrimination and authentication of the electronic device 20 within the communication network by using the subscriber identification module (e.g., a SIM card) 22g. The cellular module 22a may perform at least some of the functions that may be provided by the AP 21. The cellular module 22a may include a communication processor (CP).

Each of the WiFi module 22b, the Bluetooth module 22c, the GNSS module 22d, and the NFC module 22e may include, for example, a processor to process data transmitted/received through a corresponding module. At least some (e.g., two or more) of the cellular module 22a, the WiFi module 22b, the Bluetooth module 22c, the GNSS module 22d, and the NFC module 22e may be incorporated in a single integrated chip (IC) or an IC package.

The RF module 22f may transmit/receive, for example, a communication signal (e.g., an RF signal). The RF module 22f may include, for example, a transceiver, a power amp module (PAM), a frequency filter, a low noise amplifier (LNA), or an antenna. At least one of the cellular module 22a, the WiFi module 22b, the Bluetooth module 22c, the GNSS module 22d, and the NFC module 22e may transmit/receive an RF signal through one or more separate RF modules.

The subscriber identification module 22g may include, for example, a card that includes an embedded SIM, and may also include intrinsic identification information (e.g., integrated circuit card identifier (ICCID)) or subscriber information (e.g., international mobile subscriber identity (IMSI)).

The memory 23 (e.g., memory 11c) includes an internal memory 23a or an external memory 23b. The internal memory 23a may include at least one of, for example, a volatile memory (e.g., dynamic RAM (DRAM), static RAM (SRAM), or synchronous DRAM (SDRAM)), a non-volatile memory (e.g., One Time Programmable ROM (OTPROM), programmable ROM (PROM), erasable and programmable ROM (EPROM), electrically erasable and programmable ROM (EEPROM), mask ROM, flash ROM, flash memory (e.g., NAND flash memory, or NOR flash memory), hard drive, or solid state drive (SSD)).

The external memory 23b may further include a flash drive (e.g., compact flash (CF), secure digital (SD), micro secure digital (Micro-SD), mini secure digital (mini-SD), extreme digital (xD), multi-media card (MMC), or memory stick). The external memory 23b may be functionally and/or physically connected to the electronic device 20 through various interfaces.

The sensor module 24 may measure a physical quantity or may sense an operating status of the electronic device 20, and may then convert the measured or sensed information into electric signals. The sensor module 24 includes a gesture sensor 24a, a gyro sensor 24b, an atmospheric pressure sensor 24c, a magnetic sensor 24d, an acceleration sensor 24e, a grip sensor 24f, a proximity sensor 24g, a color sensor 24h (e.g., RGB (red, green, blue) sensor), a biometric sensor 24i, a temperature/humidity sensor 24j, an illuminance sensor 24k, and a ultra-violet (UV) sensor 24l. Additionally or alternatively, the sensor module 24 may include, for example, an E-nose sensor, an electromyography (EMG)

sensor, an electroencephalogram (EEG) sensor, an electrocardiogram (ECG) sensor, an infra-red (IR) sensor, an iris sensor, and/or a fingerprint sensor. The sensor module 24 may further include a control circuit for controlling one or more sensors incorporated therein. The electronic device 20 may further include a processor configured to control the sensor module 24 as a part of the AP 21 or separate from the AP 21 so as to control the sensor module 24 while the AP 21 is in the sleep state.

The input device 25 includes a touch panel 25a, a (digital) pen sensor 25b, a key 25c, or an ultrasonic input device 25d. The touch panel 25a, may be a capacitive type touch panel, a resistive type touch panel, an infrared type touch panel, or an ultrasonic type panel. In addition, the touch panel 25a may further include a control circuit. The touch panel 25a may further include a tactile layer so as to provide a tactile reaction to a user.

The (digital) pen sensor 25b may be, for example, a portion of the touch panel or may include a separate recognition sheet. The key 25c may include, for example, a physical button, an optical key, or a keypad. The ultrasonic input device 25d may sense, through a microphone (e.g., a microphone 28d) in the electronic device 20, ultrasonic waves that are generated by an input tool so as to confirm data corresponding to the sensed ultrasonic waves.

The display 26 (e.g., the display 11f) includes a panel 26a, a hologram device 26b, or a projector 26c. The panel 26a may include a configuration that is the same as or similar to that of the display 11f of FIG. 18. The panel 26a may be implemented to be flexible, transparent, or wearable. The panel 26a may be configured as a single module with the touch panel 25a. The hologram device 26b may show a stereoscopic image in the air using interference of light. The projector 26c may project light onto a screen so as to display an image. The screen may be located, for example, inside or outside the electronic device 20. The display 26 may further include a control circuit to control the panel 26a, the hologram device 26b, or the projector 26c.

The interface 27 may include, for example, a high-definition multimedia interface (HDMI) 27a, a universal serial bus (USB) 27b, an optical interface 27c, or a D-sub-miniature (D-sub) 27d. For example, the interface 27 may be included in the communication interface 11g illustrated in FIG. 18. Additionally or alternatively, the interface 27 may include, for example, a mobile high-definition link (MHL) interface, a secure digital (SD) card/multi-media card (MMC) interface, or an infrared data association (IrDA) standard interface.

The audio module 28 may bi-directionally convert, for example, sound and electric signals. At least some of the components of the audio module 28 may be included in, for example, the input/output interface 11e illustrated in FIG. 18. The audio module 28 may process sound information input or output through, for example, a speaker 28a, a receiver 28b, an earphone 28c, or a microphone 28d.

The camera module 29a is a device that is capable of photographing, for example, a still image and a moving image. The camera module 29a may include one or more image sensors (e.g., a front sensor or a rear sensor), a lens, an image signal processor (ISP), or a flash (e.g., LED or xenon lamp).

The power management module 29d may manage, for example, the electric power of the electronic device 20. The power management module 29d may include a power management integrated circuit (PMIC), a charger integrated circuit (IC), or a battery or fuel gauge. The PMIC may be configured in a wired and/or wireless charge type. The wireless charge type may include, for example, a magnetic resonance type, a magnetic induction type, or an electromagnetic wave type, and may further include an additional circuit for wireless charging (e.g., a coil loop, a resonance circuit, or a rectifier). The battery gauge may measure the residual capacity of the battery 29e, and a voltage, a current, or a temperature during the charge. The battery 29e may include, for example, a rechargeable battery and/or a solar battery.

The indicator 29b may indicate a specific status of the electronic device 20 or of a part thereof (e.g., the AP 21), such as a booting status, a message status, or a charged status. The motor 29c may convert an electric signal into a mechanical vibration, and may generate, for example, a vibration or a haptic effect. The electronic device 20 may include a processor (e.g., a GPU) to support a mobile TV. The processor to support a mobile TV may process media data according to the standards of, for example, digital multimedia broadcasting (DMB), digital video broadcasting (DVB), or MediaFLO™.

Each of the above-described component elements of hardware according to an embodiment of the present disclosure may be configured with one or more components, and the names of the corresponding component elements may vary based on the type of electronic device. The electronic device may include at least one of the aforementioned elements. Some elements may be omitted or other additional elements may be further included in the electronic device. Also, some of the hardware components may be combined into one entity, which may perform functions identical to those of the relevant components before the combination.

The term "module" as used herein may refer to a unit including one of hardware, software, and firmware or a combination of two or more of them. The term "module" may be interchangeably used with, for example, the terms "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" may include at least one of an application-specific integrated circuit (ASIC) chip, a field-programmable gate arrays (FPGA), and a programmable-logic device for performing operations which has been known or are to be developed hereinafter.

At least some of the devices (for example, modules or functions thereof) or the method (for example, operations) according to an embodiment of the present disclosure, may be implemented by a command stored in a computer-readable storage medium in a programming module form. The instruction, when executed by a processor (e.g., the processor 11b), may cause the one or more processors to execute the function corresponding to the instruction. The computer-readable storage medium may be, for example, the memory 11c.

The computer readable recoding medium may include a hard disk, a floppy disk, magnetic media (e.g., a magnetic tape), optical media (e.g., a compact disc read only memory (CD-ROM) and a digital versatile disc (DVD)), magneto-optical media (e.g., a floptical disk), a hardware device (e.g., a read only memory (ROM), a random access memory (RAM), a flash memory), and the like. In addition, the program instructions may include high level language codes, which may be executed in a computer by using an interpreter, as well as machine codes made by a compiler. The aforementioned hardware device may be configured to operate as one or more software modules in order to perform the operation of the present disclosure, and vice versa.

As described above, an electronic device, according to an embodiment of the present disclosure, includes a case member that includes a first face (e.g., the front face on which the above-described display device 102 is mounted), a second face that is opposite to the first face, and side walls that enclose a space between the first face and the second face, an elongated first metallic member (e.g., the above-described first radiating conductor 161 or 263*a*) that forms at least a portion of the side walls of the case member or is formed adjacent to the side walls, a metal pattern (the above-described power feeding conductor 161*a* or 263*b*) that is positioned within the case member and extends from one portion of the first metallic member to another portion of the first metallic member, the first metallic member and the metal pattern electrically forming at least a portion of a closed loop, a wireless communication integrated circuit (e.g., the above-described communication module 22) that is electrically connected to a portion of the metal pattern, and a ground member (e.g., the above-described ground portion G) that is positioned within the case member.

At least a portion of the metal pattern is disposed adjacent to the ground member.

According to an embodiment of the present disclosure, when the wireless communication integrated circuit operates, an electromagnetic coupling may be formed between at least a portion of the metal pattern and the ground member.

According to an embodiment of the present disclosure, the electronic device may further include a second metallic member (e.g., the above-described radiating member(s) 162 or 163) that is disposed adjacent to any one end of the first metallic member and forms another portion of the side walls of the case member.

According to an embodiment of the present disclosure, the second metallic member may be fed with power at one end thereof and may be connected to the ground member at the other end thereof to form a loop antenna.

According to an embodiment of the present disclosure, one end of the second metallic member may be disposed adjacent to any one end of the first metallic member.

According to an embodiment of the present disclosure, the second metallic member may be fed with power at any one location between opposite ends thereof and the opposite ends may be connected to the ground member to form a slot antenna.

According to an embodiment of the present disclosure, any one end of the second metallic member may be disposed adjacent to any one end of the first metallic member and the metal pattern.

According to an embodiment of the present disclosure, the second metallic member may form a loop antenna or a slot antenna, and the electronic device may further include a third metallic member (e.g., the above-described third radiating conductor(s) (165*a* or 165*b*) that is disposed within the loop or the slot that is formed by the second metallic member.

According to an embodiment of the present disclosure, the third metallic member may form an inverted f antenna (IFA).

According to an embodiment of the present disclosure, the electronic device may further include a support member that is disposed inside the case member and a circuit board that is installed on the support member and disposed to face at least a portion of the metal pattern.

The metal pattern may be disposed to be adjacent to at least one of the support member and the circuit board.

According to an embodiment of the present disclosure, the ground member may be provided on at least one of the support member and the circuit board.

According to an embodiment of the present disclosure, a portion of the first metallic member and the metal pattern may form a closed loop shape of any one of a polygonal shape and an at least partially circular or oval shape.

According to an embodiment of the present disclosure, the metal pattern is disposed to be closer to the other end of the first metallic member than to the one end of the first metallic member.

According to an embodiment of the present disclosure, the first metallic member may be fed with the power through the metal pattern to form a resonant frequency in the first frequency band and the second frequency band that is higher than the first frequency band.

According to an embodiment of the present disclosure, the electronic device may further include second metallic members that are disposed adjacent to opposite ends of the first metallic member, respectively, and form another portion of the side walls of the case member.

The second metallic member positioned at one side may be fed with power at one end that is adjacent to the first metallic member, and may be connected to the ground member at the other end. The second metallic member positioned at another side may be connected to the ground member at the opposite ends thereof, and may be fed with power at any one point between the opposite ends.

An electronic device, according to an embodiment of the present disclosure, may include a housing (e.g., the above-described case member 101) that includes a first face, a second face that is directed opposite to the first face, and side walls that enclose a space between the first face and the second face, a first antenna (e.g., the above-described first radiating conductor 161 or 263*a*) that is formed by using a first portion that includes a portion of one of the side walls of the housing, or is formed adjacent to the first portion, a second antenna (e.g., the above-described second radiating conductor(s) 162 or 163) that is formed by using a second portion that includes another portion of the one of the side walls of the housing, or is formed adjacent to the second portion, one or more wireless communication circuits (e.g., the above-described communication module 22) that are electrically connected to at least one of the first antenna and the second antenna, and a battery that is disposed within the housing.

The first antenna and the second antenna are formed of different kinds of antennas.

According to an embodiment of the present disclosure, the electronic device may further include the first antenna including a monopole antenna, and the second antenna includes at least one of a loop antenna, a slot antenna, and an inverted f antenna (IFA).

According to an embodiment of the present disclosure, at least one of the side walls may include a metallic material, and may include a non-metallic material between the first portion (e.g., the portion where the first radiating conductor 161 or 263*a* is formed and disposed) and the second portion (e.g., the portion where the second radiating conductor(s) 162 or 163) such that the first portion and the second portion may be electrically insulated from each other.

According to an embodiment of the present disclosure, the electronic device may further include a third antenna (e.g., the above-described third radiating conductor 165*a* or 165b) that is disposed within the housing, and is formed adjacent to the second portion.

According to an embodiment of the present disclosure, the first to third antennas may be formed of different kinds of antennas.

According to an embodiment of the present disclosure, the first antenna may include a monopole antenna, the second antenna may include a slot antenna or a loop antenna, and the third antenna may include an inverted f antenna (IFA).

In addition, according to an embodiment of the present disclosure, an electronic device may include a housing (e.g., the above-described case member 101) that includes a first face, a second face that is directed opposite to the first face, and side walls that enclose a space between the first face and the second face, a first antenna (e.g., the above-described first radiating conductor 161 and power feeding conductor 161*a*) that includes a closed loop formed by using a first portion that includes a portion of one of the side walls of the housing, and is formed adjacent to the first portion, a second antenna (e.g., the above-described second radiating conductor 162 or 163) that is formed by using a second portion that includes another portion of the one of the side walls of the housing, or is formed adjacent to the second portion, and is disposed adjacent to the first antenna, a printed circuit board (PCB) (e.g., the above-described circuit board 103) that is disposed within the housing and includes a ground (e.g., the above-described ground portion G); one or more wireless communication circuits (e.g., the above-described communication module 22) that are disposed on the PCB, and are electrically connected to at least one of the first antenna and the second antenna, and a battery that is disposed within the housing.

The closed loop of the first antenna may be electrically connected to the wireless communication circuits at a first position of the PCB (the position where the above-described connection terminal 131 is disposed), the second antenna may be electrically connected to the circuits at a second position of the PCB (the position to be connected to the above-described second point P2), and is electrically connected to the ground at a third position of the PCB (a position connected with the above-described third point P3), and the third position may be disposed substantially between the first position and the second position.

While the present disclosure has been shown and described with reference to certain embodiments thereof, it will be understood by those skilled in the art that various changes in form and details may be made therein without departing from the spirit and scope of the present disclosure as defined by the appended claims and their equivalents.

What is claimed is:

1. An electronic device having an antenna device, the electronic device comprising:
    a case member comprising a first face, a second face disposed opposite to the first face, and side walls that enclose a space between the first face and the second face;
    a first metallic member that forms at least a portion of the side walls of the case member or is formed adjacent to the side walls;
    a metal pattern disposed within the case member that extends from a portion of the first metallic member to another portion of the first metallic member, wherein the first metallic member and the metal pattern electrically form at least a portion of a closed loop;
    a wireless communication circuit electrically connected to a portion of the metal pattern; and
    a ground member disposed within the case member, wherein at least a portion of the metal pattern is disposed adjacent to the ground member.

2. The electronic device of claim 1, wherein when the wireless communication integrated circuit operates, an electromagnetic coupling is formed between at least a portion of the metal pattern and the ground member.

3. The electronic device of claim 1, further comprising a second metallic member disposed adjacent to an end of the first metallic member, the second metallic member forming another portion of the side walls of the case member.

4. The electronic device of claim 3, wherein a first end of the second metallic member is fed with power and a second end of the second metallic member is connected to the ground member to form a loop antenna.

5. The electronic device of claim 4, wherein one of the first or second ends of the second metallic member is disposed adjacent to an end of the first metallic member.

6. The electronic device of claim 3, wherein the second metallic member is fed with power between opposite ends thereof and the opposite ends are connected to the ground member to form a slot antenna.

7. The electronic device of claim 6, wherein one of the ends of the second metallic member is disposed adjacent to an end of the first metallic member and the metal pattern.

8. The electronic device of claim 3, wherein the second metallic member forms a loop antenna or a slot antenna, and wherein the electronic device further comprises a third metallic member disposed inside the loop antenna or the slot antenna formed by the second metallic member.

9. The electronic device of claim 8, wherein the third metallic member forms an inverted f antenna (IFA).

10. The electronic device of claim 1, further comprising:
    a support member disposed inside the case member; and
    a circuit board installed on the support member and disposed to face at least a portion of the metal pattern,
        wherein the metal pattern is disposed adjacent to at least one of the support member and the circuit board.

11. The electronic device of claim 10, wherein the ground member is provided on at least one of the support member and the circuit board.

12. The electronic device of claim 1, wherein a portion of the first metallic member and the metal pattern forms a shape of any one of a polygonal shape, a partially circular shape, and an oval shape.

13. The electronic device of claim 1, wherein the metal pattern is disposed closer to one end of the first metallic member than to the other end of the first metallic member.

14. The electronic device of claim 1, wherein the first metallic member is fed with power through the metal pattern to form an antenna with a first resonant frequency and a second resonant frequency, and
    wherein a second frequency band associated with the second resonant frequency is higher than a first frequency band associated with the first resonant frequency.

15. The electronic device of claim 1, further comprising:
    second metallic members disposed adjacent to opposite ends of the first metallic member, respectively, the second metallic members forming another portion of the side walls of the case member,
    wherein one of the second metallic members positioned at one side of the case member is connected to power at one end that is adjacent to the first metallic member, and is connected to the ground member at the other end, and another of the second metallic members positioned at the other side of the case member is connected to the ground member at the opposite ends thereof and is fed with power at a point between the opposite ends.

* * * * *